United States Patent [19]

Markham

[11] Patent Number: 4,577,290

[45] Date of Patent: Mar. 18, 1986

[54] REPLICATOR WITH IMPROVED PROPAGATION PERFORMANCE

[75] Inventor: David C. Markham, Mesa, Ariz.

[73] Assignee: Motorola, Inc., Schaumburg, Ill.

[21] Appl. No.: 593,469

[22] Filed: Mar. 26, 1984

[51] Int. Cl.$^4$ ............................................. G11C 19/08
[52] U.S. Cl. ........................................ 365/12; 365/37
[58] Field of Search ........................... 365/12, 37

[56] References Cited

FOREIGN PATENT DOCUMENTS 0129832 10/1979 Japan ..................................... 365/37

Primary Examiner—James W. Moffitt
Attorney, Agent, or Firm—Joe E. Barbee

[57] ABSTRACT

Bubble-to-bubble interaction in a magnetic bubble domain memory is reduced by a notch provided in the outer edge of the replicator of the bubble memory device. The notch serves to slow down the movement of the bubble around the replicator or U-turn element so that it does not elongate under a critical phase of the in-plane field.

7 Claims, 3 Drawing Figures

— PRIOR ART —

REPLICATOR WITH IMPROVED PROPAGATION PERFORMANCE

BACKGROUND OF THE INVENTION

This invention relates, in general, to magnetic bubble domain memories, and more particularly, to a magnetic bubble domain memory having an improved replicator.

Magnetic bubble domain memories are becoming well known, and more recently, have been called magnetic bubble memories or just plain bubble memories. Bubble propagation in such memories is accomplished by creating a changing pattern of localized magnetic field gradients. The memories are arranged to have circulating storage loops which are commonly called minor loops. A memory will have a plurality of minor loops which are connected to a major loop. A schematic representation of the major and minor loops is shown in A. H. Bobeck U.S. Pat. No. 4,355,373. Typically bubble memories will have a replicator located between each of the minor loops and the major loop. There are two principal methods of bubble replication. The most widely used replication schemes involve the use of a pulsed conductor loop with a permalloy pattern to split a bubble into two bubbles. In this type of replicator the bubble is elongated and then severed into two bubbles by applying a control current pulse to provide a repulsive magnetic force to the middle of the elongated bubble. The other type of field access bubble replicator uses permalloy patterns only and does not require a control current pulse. This second type of replicator is commonly called a passive bubble replicator. An example of a magnetic bubble passive replicator is disclosed in Collins et al U.S. Pat. No. 4,415,987.

It has been noted that in magnetic bubble memories having the current assisted bubble splitters, problems have been exhibited particularly under conditions of dense bubble population. In other words, when the memory was loaded with the dense population of bubble domains occasionally one of the bubble domains would collapse. The bubble domain would collapse during the high bias margin operational limit. Further investigation determined that under the high bias operational limit the bubble domain would collapse during propagation around the U-turn under conditions of dense bubble population and was due to bubble-to-bubble interaction effects in the U-turn area. The U-turn area forms part of the block replicate gate.

Accordingly, it is an object of the present invention to provide an improved replicator for a magnetic bubble domain memory.

Yet another object of the present invention is to provide an improvement of operating bias margins under conditions of full bubble loading.

Yet a further object of the present invention is to provide a block replicate gate having a notch formed in one leg of the replicator.

Yet a further object of the present invention is to provide a magnetic bubble memory having improved bias margin for propagation of the bubble around the U-turn and also resulting in a memory having extended temperature capabilities.

SUMMARY OF THE INVENTION

The above and other objects and advantages of the present invention are provided in a magnetic bubble memory having an improved replicator. The replicator has been improved by adding a notch along the outer edge of the replicator. This reduces the bubble-to-bubble interaction during propagation around the U-turn by the suppression of bubble elongation at a critical bubble position on the U-turn. The suppression of bubble elongation occurs at a point adjacent to the replicating portion of the replicator.

The subject matter which is regarded as the instant invention is set forth in the appended claims. The invention itself, however, together with further objects and advantages thereof, may be better understood by referring to the following detailed description taken in conjunction with the accompanying drawings.

The exemplification set out herein illustrates the preferred embodiment of the invention in one form thereof, and such exemplification is not to be construed as limiting in any manner.

DETAILED DESCRIPTION OF THE DRAWINGS

Figure 1:
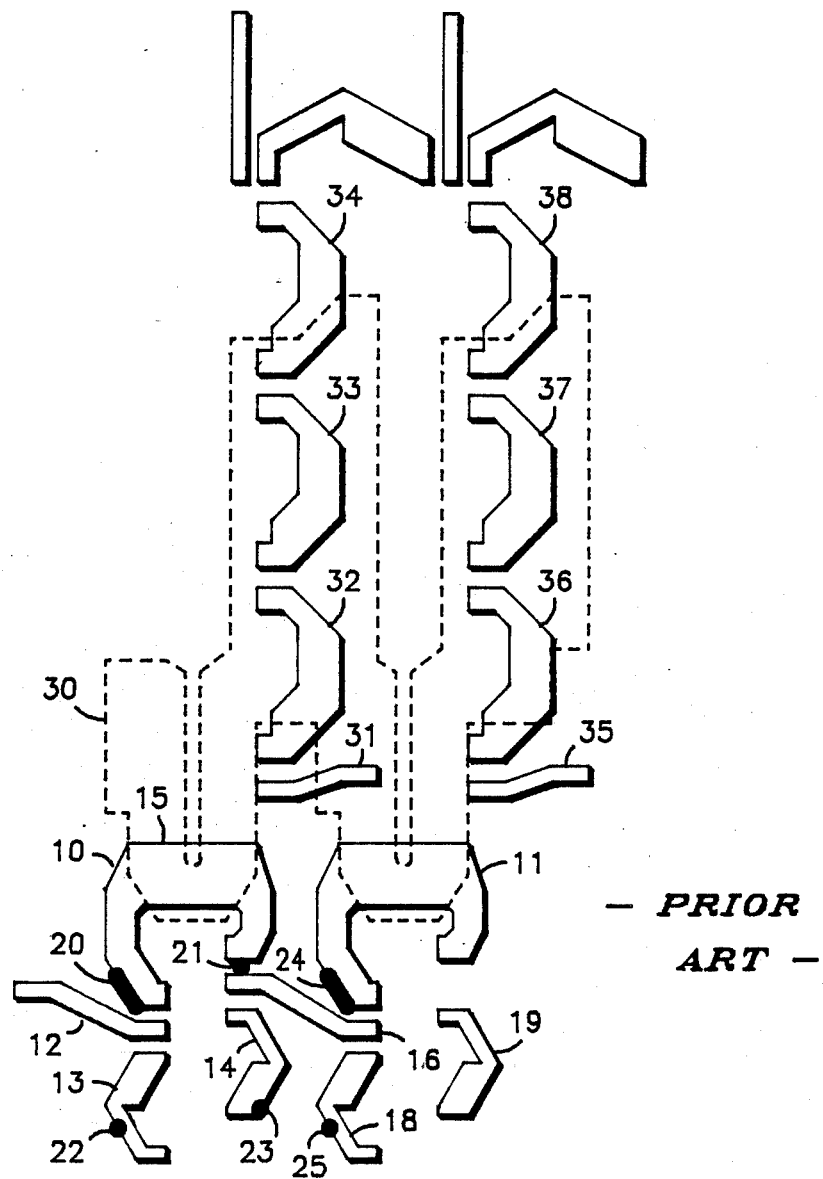
FIG. 1 shows a portion of a prior art magnetic bubble memory with the bubbles in a position to illustrate the problem.

FIG. 1 illustrates a portion of a conventional magnetic bubble domain memory which is supported on a host layer of material in which magnetic bubbles can be moved. The portion of the magnetic bubble domain memory illustrated in FIG. 1 encompasses a block replicate gate. The host layer has a plurality of elements formed thereon. The majority of these elements are in a disk or chevron configuration. The elements are magnetically soft elements, typically permalloy, and the bubble domains are moved along the elements by a magnetic field rotating in the plane of bubble domain movement. The elements have a geometry and orientation such that the rotating in-plane field produces in them consecutive offset position magnetic poles which attract bubbles and which are operative to move a bubble along a path defined by the elements.

As an example, in FIG. 1 elements 13 and 14 help provide a path in a minor loop. The minor loop would have a plurality of elements 13 and 14 all arranged in series so that the bubbles would move away from element 10 using the elements in alignment with element 13 and back to element 10 using the elements aligned with element 14. Element 10 is a U-turn element and serves as a replicator to replicate bubbles arriving from element 14 by way of bar 16 onto element 10. As the bubble reaches portion 15 of element 10 it is stretched by virtue of the fairly massive permalloy area at portion 15, and by properly timed application of a control pulse to conductor loop 30 and the proper rotation of the in-plane field the bubble can be replicated or split so that a portion continues on around element 10 down to bar 12 onto element 13 while the other portion that is split off moves up to bar 31 onto element 32 and eventually onto element 33, and then to element 34. The bubble that is split off would eventually reach the major loop which is shown by the pattern above element 34 and would move perpendicular to the movement of the bubble along elements 32, 33 and 34. As the in-plane field continues to rotate the bubble from element 10 would be coupled by bar 12 to element 13 and would continue on this path in the minor loop.

A second minor loop is illustrated having elements 18 and 19 along with U-turn element 11. In the second minor loop a bubble would move from element 19 onto element 11 and can be replicated by replicator 11 by application of the proper control current pulses on control conductor 30. The replicated bubble can move onto bar 35 to element 36, and then elements 37 and 38 under control of the in-plane rotating field H. The bubble moves around U-turn element 11 and is coupled by bar 16 unto element 18 and continues along the minor loop path where it is turned around at the opposite end and again moved down the path by elements in alignment with element 19. The rotating field causes a first magnetic pole end at the input leg of U-turn element 11 and a second magnetic pole end at the output leg of element 11.

Figure 2:
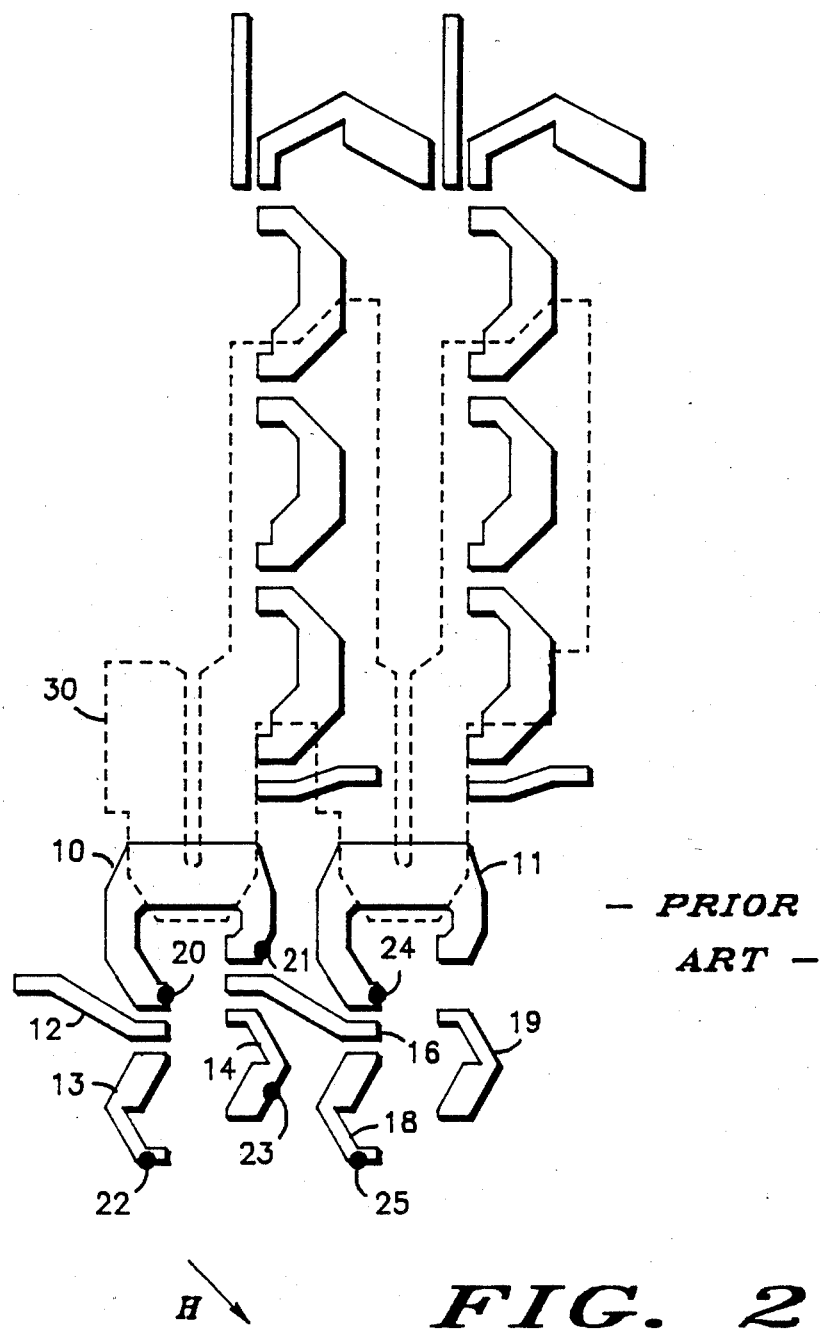
FIG. 2 is like FIG. 1 with the bubbles further along the U-turn area.

The problem that the present invention solves occurs under conditions of dense bubble population. It was found that under dense bubble population and under high bias conditions a bubble would collapse. After much investigation it was determined that the collapse was occurring in the block replicate gate area. As it can be seen, the corner or U-turn element 10 is a broad face element on which the bubble stretches along portion 15 with the aid of the fairly massive permalloy structure. Since it takes approximately one and a quarter cycles of the in-plane rotating field H to move a bubble all the way through element 10, two bubbles co-exist on element 10 for a fraction of a field cycle. Normally this condition does not cause any adverse effect because the pole strength of the massive element 10 is large enough to overcome the repulsive permalloy-mediated bubble-to-bubble interaction. However, when the bias field approaches its upper limit it was found that bubble 21 was collapsing. The interaction of bubble 20 with bubble 21 is not enough to cause bubble 21 to collapse; however, when the interaction of bubble 24 with bubble 21 is also present then it becomes possible for bubble 21 to collapse. Part of the problem is that bubbles 20 and 24 are in an elongated state during this phase of the in-plane field H. Once in-plane field H rotated past this point, bubbles 20 and 24 were no longer elongated and the danger of collapsing bubble 21 passed. This situation is illustrated in FIG. 2. Note that in FIG. 1 the in-plane field illustrated by arrow H is in the third quadrant while in FIG. 2 the in-plane field illustrated by arrow H is in the fourth quadrant. As the in-plane field continues to rotate, bubble 21 moves up towards stretching portion 15 while bubble 20 moves across bar 12 onto element 13 after bubble 22 has moved off of element 13 onto an adjacent element (not shown).

Figure 3:
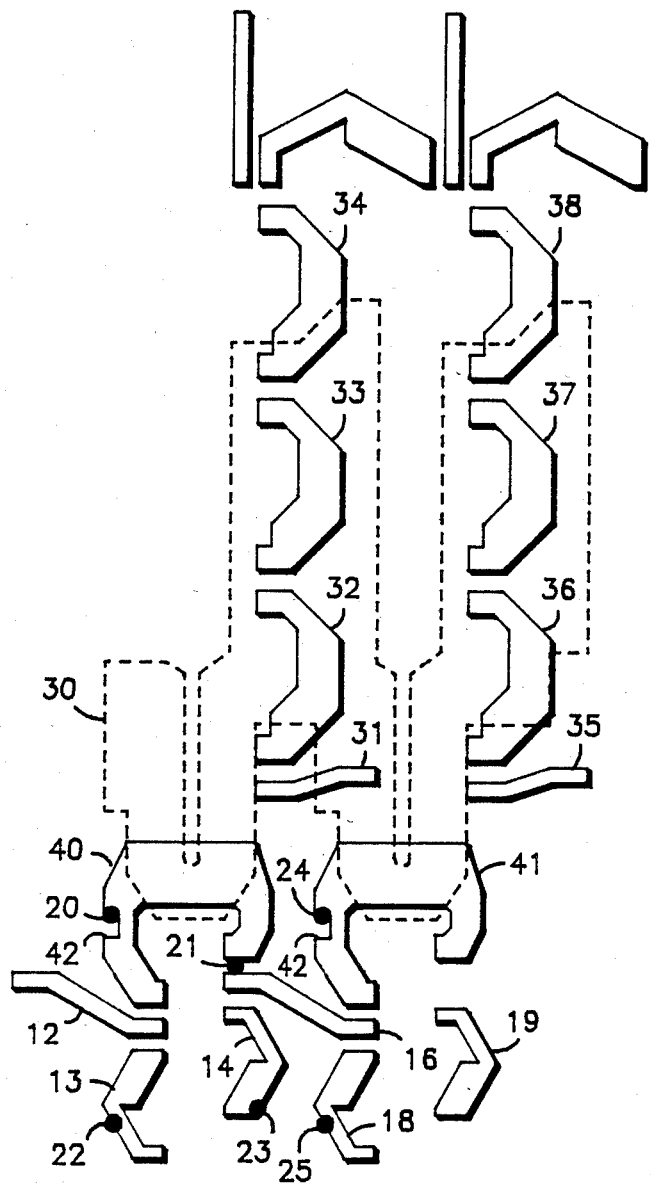
FIG. 3 illustrates a portion of a magnetic bubble memory showing an embodiment of the present invention.

FIG. 3 illustrates an embodiment of the present invention which keeps bubbles 20 and 24 from reaching the lower output leg of elements 40 and 41, respectively, when the in-plane field is in the third quadrant as illustrated by arrow H. Note that corner or U-turn elements 40 and 41 each have a notch 42. Notch 42 is in the outer edge of the output leg and introduces a discontinuity which momentarily slows down the bubble. All other elements of the bubble memory remain the same as illustrated in FIGS. 1 and 2. By momentarily storing or stopping the bubble at notch 42 the in-plane field H does not cause the bubble elongation which resulted in the detrimental bubble-to-bubble interaction. In other words, the reduction in bubble-to-bubble interaction is achieved by suppression of the bubble elongation at a critical bubble position on the corner or U-turn element. The suppression of bubble elongation is achieved by a rectangular notch in the outer edge of the U-turn element to provide a discontinuity thereby temporarily storing or momentarily slowing down the bubble. This reduces the bubble-to-bubble interaction during propagation around the U-turn to a level comparable to that experienced in the storage area of the minor loops without compromising replication performance or decreasing bit storage density.

The notch in the U-turn element forms a magnetic pole modifying bubble propagation along the output leg and holds the bubble at a critical phase or angle of the in-plane field. Not only does the notch prevent the bubble from elongating but holds the bubble more distance from the bubble on the input leg of the U-turn element. It should be noted that the pole strength created at the notch is insufficient to cause bubble elongation. Propagation from the notch to the end of the output leg is more rapid than in the conventional bubble memory but does not compromise performance; otherwise memory operation is the same as before.

On a specific bubble memory the notch was found to increase the bias margin by 33 percent and allowed satisfactory operation of the memory over an extended temperature range. This follows from the fact that bias margin shrinks with increasing temperature, and therefore, by increasing the bias margin the temperature can be increased further before the bias margin is shrunk below a specified limit. The increase in bias margin also results in a higher production yield. Process parameters effect the bias margin and can cause the bias margins to be below the specified limit. However, with the increase in bias margin resulting from the present invention, a greater number of devices from a production lot will now have a bias margin above the minimum specified limit. By now it should be appreciated that a multitude of advantages are achieved by the present invention.

Although the invention has been illustrated in conjunction with a closely spaced block replicate gate, it will be understood that the invention will offer advantages in any closely packed replicate gate.

I claim:

1. A magnetic bubble domain memory replicator for replicating magnetic bubble domains and having a first magnetic pole end, a second magnetic pole end, a replicating area, and a notch located in the replicator adjacent to the second magnetic pole end for momentarily storing a magnetic bubble domain as the domain moves from the replicating area to the second magnetic pole end.

2. The magnetic domain memory replicator of claim 1 wherein the first magnetic pole end receives magnetic bubble domains and the second magnetic pole end outputs magnetic bubble domains from the replicator.

3. A method of propagating a magnetic bubble domain around a replicator comprising: moving a magnetic bubble domain onto the replicator; moving the magnetic bubble domain to a replicating portion of the replicator; momentarily delaying the magnetic bubble domain by using a notch at a point past the replicating portion; and then moving the momentarily stored magnetic bubble domain off the replicator.

4. A magnetic bubble domain memory having a plurality of spaced apart magnetically operative material capable of supporting magnetic bubble domains and arranged to form a path along which the domains can be moved, and a replicator placed adjacent the plurality of spaced apart magnetically operative material to receive the domains, the replicator having notch means for slowing down movement of the domains at a location past a portion of the replicator where replication takes place.

5. The magnetic bubble domain memory of claim 4 wherein the means is a notch cut in the periphery of the replicator.

6. The magnetic bubble domain memory of claim 4 wherein the replicator is a U-turn element and forms part of a block replicate gate.

7. The magnetic bubble domain memory of claim 5 wherein the notch is rectangular in shape.

* * * * *